(12) United States Patent
Hamasaki et al.

(10) Patent No.: US 6,654,393 B2
(45) Date of Patent: Nov. 25, 2003

(54) SEMICONDUCTOR LASER DEVICE

(75) Inventors: Hiroshi Hamasaki, Kanagawa-ken (JP); Hideto Furuyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 65 days.

(21) Appl. No.: 10/090,609

(22) Filed: Mar. 6, 2002

(65) Prior Publication Data
US 2002/0136256 A1 Sep. 26, 2002

(30) Foreign Application Priority Data
Mar. 6, 2001 (JP) ........................................ 2001-062175
Mar. 6, 2001 (JP) ........................................ 2001-062176

(51) Int. Cl.[7] .............................. H01S 5/22; H01S 5/06
(52) U.S. Cl. ........................ 372/29.02; 372/36; 372/31
(58) Field of Search .......................... 372/36, 50, 109, 372/29.02, 29.021, 31

(56) References Cited

U.S. PATENT DOCUMENTS

| 5,479,426 A | * 12/1995 | Nakanishi et al. | ............. 372/43 |
| 5,793,785 A | * 8/1998 | Nakanishi et al. | ............. 372/36 |
| 6,242,760 B1 | * 6/2001 | Hamaguchi et al. | ........... 257/80 |
| 6,459,711 B1 | * 10/2002 | Hamaguchi et al. | ............. 372/36 |

FOREIGN PATENT DOCUMENTS

| JP | 5-315700 | 11/1993 |
| JP | 2000-12858 | 1/2000 |
| JP | 2001-15849 | 1/2001 |

OTHER PUBLICATIONS

H. Satoh, et al., SPIE, Optical Data Storage, vol. 1499, pp. 324–329, "Fast Laser Power Control for High Density Optical Disk Systems", 1991 (No month).

T. Sato, et al., IEEE IEDM 99, pp. 517–520, "A New Substrate Engineering for the Formation of Empty Space in Silicon (ESS) Induced by Silicon Surface Migration", Sep. 1999.

* cited by examiner

Primary Examiner—James Davie
(74) Attorney, Agent, or Firm—Oblon, Spivak, McClelland, Maier & Neustadt, P.C.

(57) ABSTRACT

A semitransparent mirror is utilized to reflect a laser light emitted from a semiconductor laser component used for a light source for an optical disc such as DVD-RAM, and a photo detector receiving the laser light having passed therethrough for monitoring with FAPC system is positioned behind the mirror. Furthermore, a transparent medium layer with a predetermined thickness is provided between the semitransparent mirror and the photo detector. Thanks to the transparent medium layer, the returned extra light from the DVD-RAM does not enter the photo detector and deviates therefrom, after it has passed through the semitransparent mirror.

26 Claims, 5 Drawing Sheets

SEMICONDUCTOR LASER DEVICE

CROSS-REFERENCE TO RELATED APPLICATIONS

This application is based upon and claims the benefit of priority from the prior Japanese Patent Application Nos. 2001-62175, filed on Mar. 6, 2001 and 2001-62176, filed on Mar. 6, 2001; the entire contents of which are incorporated herein by reference.

BACKGROUND OF THE INVENTION

1. Field of the Invention

The present invention relates to a semiconductor laser used for a light source of optical communication, optical transmission technology and optical information recording.

2. Description of the Related Art

Recently semiconductor lasers are widely put to practical use as a light source in the field of optical communication, optical transmission and optical information recording, etc., because of coherency of emitted light, of competence for high speed operation or of very small size. The semiconductor laser is mounted on a metallic member such as a lead frame or a metal block so that it can emit a stimulated light thanks to a current flowing from outside thereof and can ensure a passage for heat-radiation because the light intensity varies sensitively in proportion to heat change. To mitigate the difference of thermal expansion coefficient between the metal and the semiconductor material constituting the semiconductor laser, the semiconductor laser is mounted on the metallic member after it is mounted on a substrate material called 'sub-mount' of such as silicon (Si) or aluminum nitride (AlN). Besides, the semiconductor laser is realized by a medium with an amplification rate larger than 1 intervening in a resonator comprised of a plurality of reflection mirrors. An edge emission type semiconductor laser, which utilizes cleaved surfaces of a crystal as the reflection mirrors for the resonator and can take a long distance in the amplifying media through which the light passes, has been mainly developed. Although a surface emission type laser, which emits a radiation in the direction normal to the substrate of high reflection mirror made of such as a semiconductor or a multi-layered dielectric material, is partially put to practical use, there are many problems that the technology is not yet sufficient but mostly still at development stage with regard to a certain material, in other words, to a certain emitted radiation wavelength. Therefore, almost all the lasers utilized in various application products are edge emission type.

However, following problems arise when the edge emission type semiconductor laser is mounted on the sub-mount. A light beam emitted out of the edge diffracts largely and diffuses, because active region of the semiconductor laser is formed as a waveguide structure whose cross section is very small so as to improve the efficiency of amplification, preventing the light from escaping out of the amplification region and therefore causing a loss. In general, because a thin region with a thickness of the degrees of the wavelength can be formed in the direction perpendicular to the component substrate by means of, for example, crystal growth technology, confinement of the light to the region of the degrees of the wavelength is carried out. On the other hand, a confining region is formed by a flat structure in relation to the parallel direction thereto, so that it is difficult to confine the light within the degrees of the wavelength. In addition to the above reason, the light is confined in a region wider than the wavelength in order to prevent the component resistance from increasing. Therefore, diffraction angle expands largely in the perpendicular direction as compared with the parallel direction. For example, the expanding angle of the light beam, i.e. the direction in which the light intensity becomes $1/e^2$ of the light intensity on the optical axis, is approximately 10 degrees to the optical axis in the parallel direction, whereas the angle is approximately 30 degrees in the perpendicular direction. When the component is mounted on the flat sub-mount, the light beam reaches the mounted surface in the vicinity of the component (for example, at 200 micrometers for the light emitting portion positioned at 100 micrometers above the mounted surface), resulting in reflection, scattering, absorption, etc., which causes deformation of the light beam due to occurrence of so-called 'an eclipse', in a part of the light beam. The phenomenon has a bad influence on connecting it to an optical pickup or an optical fiber utilizing a light beam. Consequently, when the component is mounted, it is necessary to adopt a means such as a structure where the laser component is mounted in the vicinity of the edge of the sub-mount so as to prevent the light from being eclipsed. Therefore, the relation of the position of the semiconductor laser to the position of the mounted surface should be limited, so that flexibility of the mount gets worse.

One method to solve the problem mentioned above is proposed as follows (e.g. Japanese unexamined patent disclosure No. Hei05-315700): The structure of the proposal is that the semiconductor laser component is mounted on a silicon substrate as the sub-mount, and the light beam outputs upward above the substrate by reflecting the beam on a oblique wall surface standing on the substrate. The output light according to this structure is reflected upward in the vicinity of the semiconductor component before it diffuses in a large scale, so that the output light can be taken out with the beam form being practically kept because the eclipse at the mounted surface is small without taking particularly the relation of the position to the mounted surface in consideration.

Meanwhile, the semiconductor laser varies sensitively the light output thereof in accordance with change of the circumambient temperature. Consequently, it is desirable that both the semiconductor laser and the mount substrate should be mounted together on a component being able to control the temperature, for example Peltier device. However because the mount substrate and the sub-mount even have some heat capacitance, though it is small, a method by which feedback control for the driving current circuit of the laser component is carried out by monitoring the actual output light is adopted, if accurate light output control is required. This is called 'automatic power control (APC)'.

Because the edge emission type semiconductor laser has both end surfaces formed by e.g. cleaved surfaces working as the resonator mirrors, the output lights are symmetrically emitted in both front and rear directions as far as reflectance of the edges is specially not controlled. Although the aforementioned APC can be constructed by monitoring the rear-side-emitted light with a photo detector, utilization efficiency of the light decreases because the monitored light does not contribute to the signal source. Therefore, a method to improve the utilization efficiency of the light as much as possible by means of raising the reflectance of the rear-end surface with a multi-layered dielectric film, etc., is carried out for a system where raising an output or an efficiency thereof is required. In such a case, the emitted light out of the rear side, which can be used for the monitor, decreases, and consequently the SN ratio becomes too low to carry out the accurate APC. For reasons of the above, it is necessary to monitor a part of the front-side output light (signal light). Such control system is called 'front APC (hereinafter denoted by FAPC)'.

FIG. 7 shows an example of the structure where the semiconductor laser is used for the FAPC system. The aforementioned Japanese unexamined patent disclosure No. Hei05-315700 and another Japanese unexamined patent disclosure No.2001-15849 propose a following structure. Namely, as shown in FIG. 7, the structure comprises a semitransparent film formed on a sub-mount 100 and a photo detector for a front monitor, which is formed by p-n junction by means of diffusion process, located behind the film. Mark 101 denotes a semiconductor laser, and a means, such as a half mirror 103, etc. for splitting the output light is positioned facing to an end surface 102 thereof. On the rear surface of the half mirror 103, a photo detector 104 for the monitor is arranged, and an optical input portion 105 is formed on a part thereof. A light 111 emitted from the semiconductor laser 101 is split by the half mirror 103, and a portion of the light becomes an output light 112, which travels toward, for example, an optical disc. A part 113 of the remainder enters the photo detector 104 for the light output monitor so as to output a monitor photocurrent for the APC. Applying the photocurrent to the APC circuit, the output light of the semiconductor laser is controlled. Usually, because the frequency band of the APC circuit is set up lower from dozens to hundreds hertz, the circuit is designed to distinguish slow components of the variation of the output light emitted from the semiconductor laser in order to control them. This is because factor of the variation of the light from the semiconductor laser is mainly variation of the temperature.

On the other hand, considering the application to optical discs, etc., the output light is reflected by the surface of the optical disc, and then enters a signal light detector, etc., after the light is split by a hologram component, etc. inserted on the way. However, because splitting the light with the hologram component utilizes diffraction, 100% of the reflected light is not necessarily diffracted but there are some return lights going back to the light source via the forward path as it is a backward path, due to such as the difference of the double diffractive index of the optical disc medium. To this end, reducing noises caused by the return light of the semiconductor laser is carried out by high frequency superposition technology that continues to give the semiconductor laser a predetermined amount of modulation at a frequency higher than the signal frequency. In FIG. 7, marks 114 and 115 represent the return light and the light incident on the optical input portion 105, which is a part of the return light, respectively. Namely, in the figure, most of the return light 114 is reflected by the half mirror 103, but a part 115 thereof enters the optical input portion 105, then being fed to the APC circuit after it is added to the photocurrent due to the intrinsic emitting light 113 of the semiconductor laser, and resulting in noises. Because the frequency of the signal light included in the return light from the optical disc is usually high such as dozens megahertz to a hundred megahertz, only the average value is detected in relation to high frequency components by the APC circuit having a gain for a low frequency band, and therefore, nothing but minute offset takes place. Since the offset becomes an approximately constant minute value, it can be cancelled by adjustment of the gain of the APC circuit, and then does not matter.

However, because it is necessary that the light pulse for writing should be precisely controlled in the application to random access memory (RAM), utilizing a high speed APC is effective (Proc. SPIE vol.1499, pp.324–329). The high speed APC is thus effective in order to control the intensity of the writing light pulse and to reduce the return light noise.

There is a problem that the monitor noise caused by the aforementioned return light is all amplified as a noise, and in consequence the APC even does not work as well, if the frequency band of the APC circuit becomes equal to or higher than the signal frequency.

As described above in detail, there has been a problem that the return light enters the photo detector for the front monitor and causes some noises on the APC circuit in the semiconductor laser device that emits the light in a direction tilting to the mounted surface, e.g. in the direction perpendicular thereto by means of an oblique surface formed on the sub-mount as a reflection mirror, wherein the reflection mirror is prepared to be semitransparent and the photo detector is positioned on the rear surface thereof.

BRIEF SUMMARY OF THE INVENTION

The present invention is intended to provide a semiconductor laser device wherein any extra light such as a return light does not enter an optical input portion of a photo detector in a front monitor using a semitransparent mirror.

Therefore, an aspect of the invention is a semiconductor laser device comprising:
 a semiconductor laser component emitting a laser light; and
 an optical control mechanism located in front of the semiconductor laser component and comprising
 a semitransparent mirror reflecting the emitted laser light to control the direction of the optical axis of the laser light,
 a photo detector united with the semitransparent mirror and receiving a part of light having passed through the semitransparent mirror, and
 an optically transparent medium layer intervening between the semitransparent mirror and the photodetector; the optically transparent medium layer having a thickness to make an extra light coming back from the outside to the semitransparent mirror via the optical axis of the reflected laser light deviate from the optical input portion of the photo detector.

This aspect is provided with the transparent layer with a predetermined thickness, intervening between the semitransparent mirror and the photo detector located behind the mirror. The structure can provide an arrangement where the optical axis of the return light does not pass the optical input portion of the photo detector after it passes through the transparent medium layer, and consequently can be controlled by the high speed FAPC system in which all or most of the return lights do not enter the optical input portion, so that the return light noise can be remarkably diminished.

DETAILED DESCRIPTION OF THE INVENTION

Figure 1:
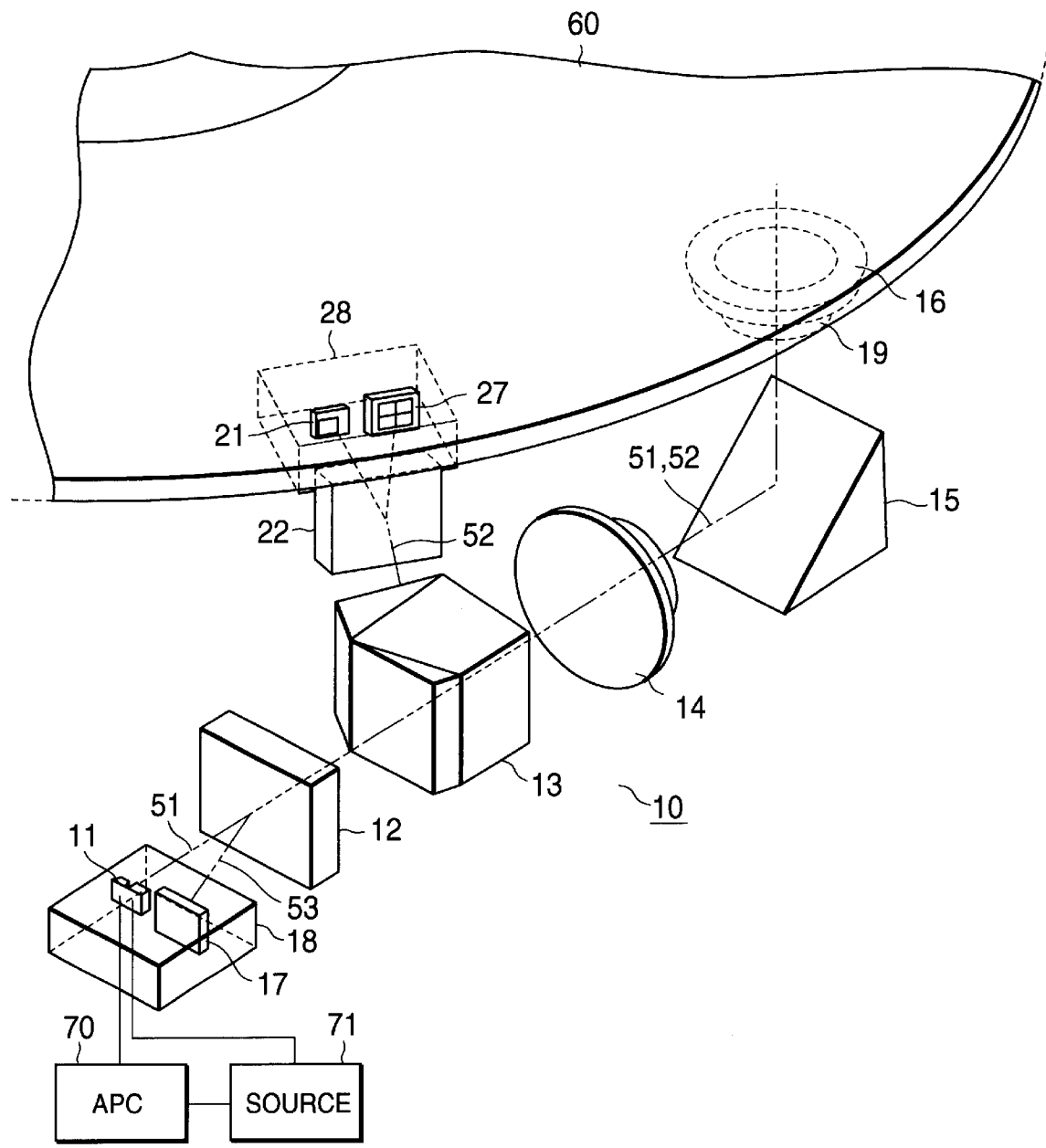
FIG. 1 is a schematic oblique view explaining the first embodiment of the present invention.

Referring to the drawings, the embodiments of the present invention will be hereinafter explained.

FIG. 1 shows an embodiment where a semiconductor laser device according to the invention is applied to an optical head. A first light source 11 of the optical head 10 emits a semiconductor laser light 51 (e.g. 650 nanometers in wavelength). The laser light 51 emitted from the first light source 11 travels through a hologram component 12 and a cube shaped beam splitter 13, and then passes through a collimator lens 14. The semiconductor laser component emitting the laser light is provided with a photo detector for an optical monitor in front of the laser component to catch a variation of the laser light output in order to stabilize the output thereof. The variation is fed back to a laser power supply 71 through an APC circuit 70 connected to the photo detector so as to control the laser light output.

A second light source 21 emits a semiconductor laser light (e.g. 780 nanometers in wavelength). A laser light 52 emitted from the second light source 21 travels through a hologram component 22 and the cube shaped beam splitter 13, and then passes through the collimator lens 14. The second light source 21 also comprises an APC circuit, though it is not shown in the figure.

The hologram component 12 is to diffract a light 53 of the backward path coming inversely from the beam splitter 13 side and to guide it to a photo detector 17. The beam splitter 13 is to guide the laser light 51 from the first light source 11 and the laser light 52 from the second light source 21 to the same out put direction as the respective forward path (collimator lens 14 side) and to output them to the direction. The beam splitter 13 is to split the reflected lights of the backward path coming inversely from the same output direction into each of the first light source 11 side and the second light source 21 side, which have originally emitted the respective lights, and to guide them there.

The light emitted from the collimator lens 14 is bent upward by a prism (or a mirror) 15, and passes through a dichromatic filter 19 and an object lens 16, and then forms a beam spot on an information-recording surface of an optical disc 60. The reflected light from the information-recording surface passes through the forward path, i.e. the object lens 16, the dichromatic filter 19, the prism 15, and the collimator lens 14 successively, and then enters the beam splitter 13. The beam splitter 13 is to guide the reflected lights of the backward path traveling inversely to the first and the second light sources 11, 21 having emitted the respective lights.

Therefore, the beam splitter 13 guides the reflected light from the disc i.e. the return light of the backward path to the hologram component 12 side when the first light source 11 is used, and guides the reflected light i.e. the return light of the backward path to the hologram component 22 side when the light source 21 is used.

The hologram component 12 can pass straight or refract a light incident thereon in compliance with the direction of polarization thereof, utilizing the diffraction effect by hologram. The light coming from the hologram component 12 is guided to the photo detector 17. Meanwhile, when the light source 21 is used, the light coming from the hologram component 22 is guided to the photo detector 27.

The first light source 11 and the photo detector 17 mentioned above are united as a unit 18. On the other hand, the second light source 21 and the photo detector 27 are united as a unit 28. The structure is therefore devised to contribute to miniaturization.

The dichromatic filter 19 positioned adjacent to the object lens 16 can restrict its aperture (small for CD, large for DVD) in compliance with the frequency of the light. The dichromatic filter 19 changes the physical location thereof, being united with the object lens 16 in accordance with focusing servo or tracking servo.

In the structure mentioned above, power control of the semiconductor laser (APC) does not require any other parts, and is integrated with the semiconductor laser devices 11 and 21 so as to enable the APC, and in consequence the optical head can be miniaturized. The return light from the optical disc 60 is guided to the photo detector 17, while a part thereof escapes back toward the photo detectors 11, 21 sides.

Figure 2:
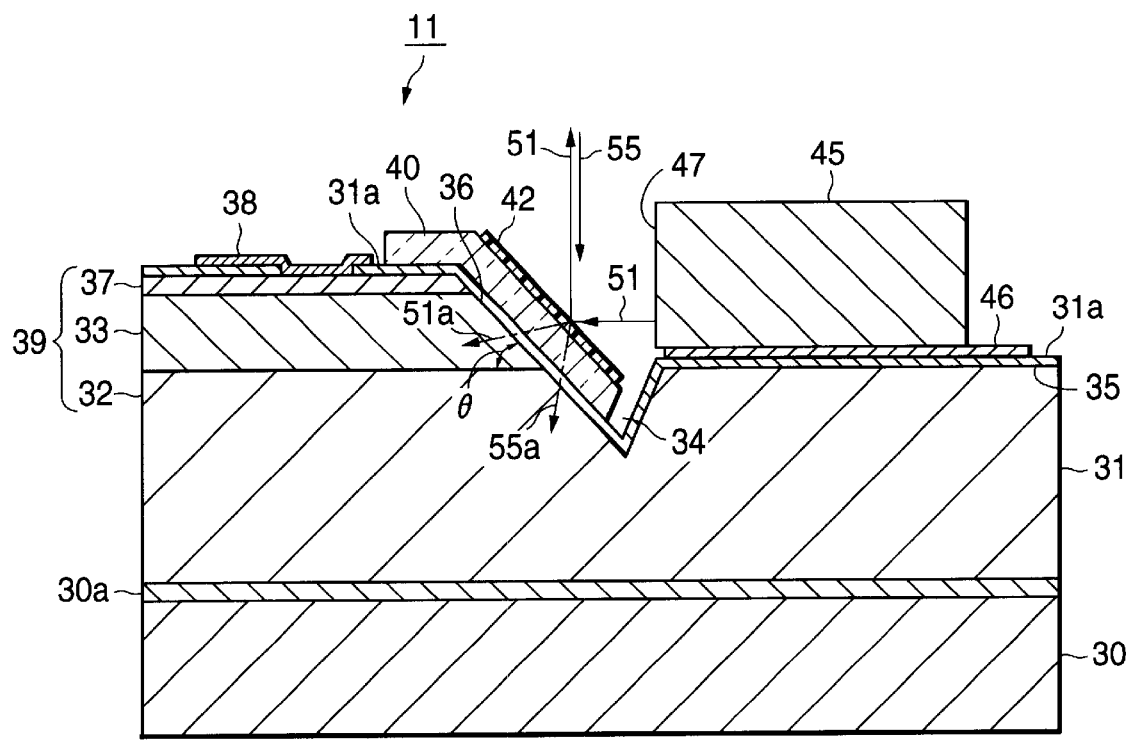
FIG. 2 is a schematic cross section of the semiconductor laser device constituting the light source in FIG. 1.

In FIG. 2, the semiconductor laser device 11, which is the first light source, is provided with a sub-mount substrate 31 on a mount 30 of metal. The sub-mount substrate 31 is made of, for example, silicon (Si), and a layer 33 of low impurity concentration is formed on an n-type substrate 32 doped by high impurity concentration by means of such as epitaxial growth. A groove 34 is formed on a part of the substrate 32, and a part (sub-mount surface) 35 of the surface 32 bordered by the groove is exposed. The edge surface of the layer 33 of low impurity concentration forms a wall surface 36 extending from the groove 34. The wall surface 36 tilts by an angle è, e.g. 45 degrees to a main surface 35 of the n-type substrate 32.

A transparent medium layer 40 permeable to the emitted light from the semiconductor laser 45 is formed on the oblique surface 36. Furthermore, a semitransparent mirror 42 comprised of e.g. a dielectric film is formed on the surface of the transparent medium layer 40. Besides, a high concentration p-doped region 37 is formed on the top of the low impurity concentration layer 33 by means of diffusion, ion injection, and other processes. The layers 32, 33, and 37 constitute a PIN type photodiode as the photo detector 39. A reverse bias voltage is applied between a lead terminal p 38 of the photodiode and the mount 30 as a reverse side electrode (n electrode) when the device is used. A semiconductor laser component 45 is an edge emission type having a resonator in the lateral direction of the figure and emitting a light from an edge surface 47, mounted on the sub-mount substrate 35 with a conductive adhesive 46. The laser emitting edge 47 of the semiconductor laser component 45 is located facing to the edge surface of the optical input portion 33.

A part of the emitted light 51 is reflected by the semitransparent mirror 42 and travels upward above the substrate, and meanwhile a light 51a, which is a part of the light passed therethrough, is incident on the oblique surface 36 as an incident surface, and then enters a depletion layer extending in the low concentration layer 33. Finally it is absorbed by the depletion layer and converted to a photocurrent. In FIG. 2, the output light beam is not supposed to be eclipsed on the substrate surface thanks to the groove 34 of the n-type substrate 32, even if the light output portion (i.e. an active layer) of the semiconductor laser component 45 is relatively adjacent to the substrate surface 35.

The laser light 51 reflected by the semitransparent mirror 42 reaches the optical disc 60, having passed through the hologram component 12. Meanwhile reflected lights from each part of the head and a part of the reflected light modulated by the disc 60 return inversely along the optical axis of the emitted light 51 and enter the semitransparent mirror 42 as lights from the outside. A part of the incident light 55a passes through the semitransparent mirror 42, and then is refracted by the transparent medium layer 40, and finally enters the n-type substrate 32. The trace of the extra light having passed through depends on the incident angle, and refractive index and thickness of the transparent medium layer 40. Especially the trace can be deviated to the outside of the optical input portion 33 of the photo detector by means of making the transparent medium layer sufficiently thick. The thickness thereof is desired 5 μm or more, especially more than 10 μm.

The return light beam 55a that has arrived at the semitransparent mirror 42 is incident on the position, which is different from the position on which the direct light beam 51 having passed through the semitransparent mirror 42 is incident. Therefore, if the optical input region 33 is located at a position on which the direct light beam 51a is incident but the return light beam 55a is not, the APC noise caused by the return light can be reduced. Because the optical input region is the depletion layer formed practically inside the low concentration layer 33, the height of the substrate surface, on which the semiconductor laser 45 is mounted, is controlled by etching process for the alignment thereof with the semiconductor laser 45. Using anisotropic etching, the relative height to the optical input portion is regulated by controlling the etching time. Moreover the height of the emitted light 51 from the substrate can also be regulated by the thickness of the adhesive 46 for the semiconductor laser device 45.

Figure 3:
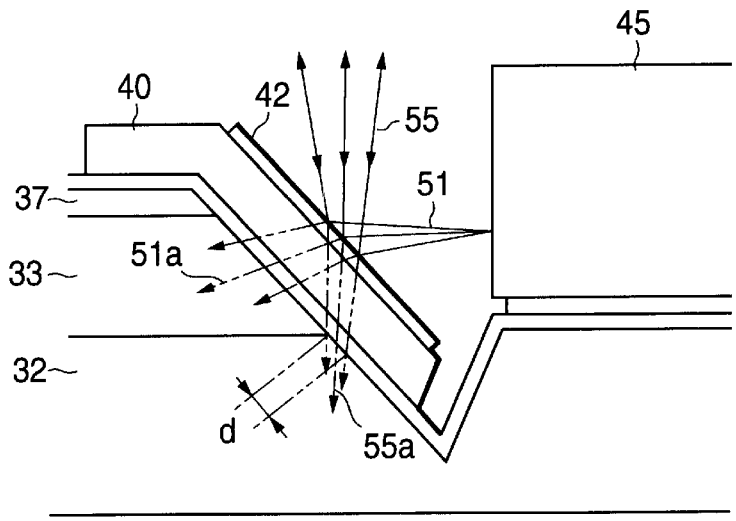
FIG. 3 is a schematic diagram explaining operation of the semiconductor laser device in FIG. 2.

FIG. 2 represents the light beam 51 by a straight line for explanation, however the light beam has a certain stretch as shown in FIG. 3 in reality. Therefore there is some possibility that a part 55a of the return light enters the optical input portion 33. Providing the transparent medium layer 40 as shown by the embodiment in order that a light adjacent to the optical axis of the return light does not enter the optical input portion 33 can remarkably diminish the return light noise. Especially, because many cases are in a condition that the beam is narrowed to a certain extent by the outside optical system, the invention becomes more effective if the extension of the beam is limited. For example, in the case of the optical disc, the extension angle of the return light is approximately 7 degrees, because the aperture of the object lens narrows the extension angle of the reflected beam irradiated by the optical disc. If the optical system is symmetric, the beam narrowed by this extension angle focuses just in the vicinity of the emitting portion of the semiconductor laser. A part thereof enters the photo detector, after it has passed through the semitransparent mirror 42.

A concrete aspect of the light beam in this case will be explained in accordance with FIG. 3. The refraction index of the transparent layer 40 is 1.46; the thickness is 20 micrometers; the extension angle of the semiconductor laser 51 is 7 degrees; the distance between the semiconductor laser and the semitransparent mirror 42 is 50 micrometers; and the angle è between the semitransparent mirror and the optical axis of the light from the semiconductor laser is substantially 45 degrees. On the present occasion, the return light beam on the surface of the photo detector 39 becomes an ellipse with a major axis of approximately 14 micrometers (d in FIG. 3). Accordingly, if the optical input portion of the photo detector is located at a position, which is out of the beam and able to receive the direct light, a structure hardly affected by the return light while it realizes the FAPC utilizing a discrepancy of the optical path can be realized.

The discrepancy between the center position of the return light beam 55a and that of the direct light beam 51 at the oblique surface 36 is approximately 22 micrometers, so that it is possible to locate the optical input portion in a position, which receives sufficiently the direct light beam 51a and does not receive the return light 55a.

This structure can be realized as follows. First of all, a wafer in which the low concentration layer 33 and the high concentration p-layer are formed on the high concentration n-substrate by e.g. epitaxial growth is etched with a solution such as potassium hydroxide (KOH), until the bottom thereof reaches the substrate 32 using a mask, which is a thermo-oxidized film or a nitride film patterned by, for example, photolithography process. Next a part of the surface 35 is patterned and etched by the same process in order to form the groove 34. In this case, the oblique surface 36 extending from the groove 34 to the low concentration layer 33 can be made of a specified crystal surface to obtain a flat surface by using an anisotropic etching solution such as KOH. Furthermore, the transparent medium layer 40 is formed over the whole surface by a transparent thick film forming process, such as forming a silicon oxide ($SiO_2$) film by chemical vapor deposition (CVD) using a liquid ingredient (e.g. tetraethyl orthosilicate (TEOS)). Thereafter, the transparent medium layer 40 is patterned on the oblique surface 36, by removing unnecessary portions with reactive ion etching (RIE), etc. After the process, the semitransparent mirror 42 is prepared with a multi-layered dielectric film, and then the lead electrode 38 of the photodiode and the rear side electrode 30a are formed. Finally it is cut as a chip by dicing, etc.

According to the embodiment mentioned above, the photo detector 39 with a mirror can be integrated on the sub-mount of the semiconductor laser component 45 to reduce the APC noise due to the return light, and consequently a miniaturized and integrated semiconductor device suitable for mass production can be realized.

A high speed pin structure is shown as a structure of the photo detector in the embodiments described up to now, but the same effect is obtained by using a usual pn type photo detector. In that case, the low concentration layer 22 is not necessary, but a depletion layer acting as the optical input portion is formed in the vicinity of the border between the p type high concentration layer and the n type high concentration layer. Although the substrate is characterized by a low price in this case, one should take notice that the structure has a low sensitivity and a low frequency response because the thickness of the depletion layer cannot be made large compared to the pin structure on the same bias. The substrate 31 comprises two epitaxial layers. However an external form is formed first by an epitaxial substrate where only the low concentration layer 33 is formed, and thereafter the P-layer 37 may be formed thereon by thermal diffusion etc. The substrate 32 is n-conduction type in the above, but p-conduction type is, of course, available. Namely, the same structure as the above can be obtained, if the conduction type of the above each layer is reversed. Moreover, a thin insulation film of such as silicon oxide ($SiO_2$) may be formed on the entire surface of the sub-mount 31. The second light source 21 has the same structure as the first light source in FIG. 1.

Figure 4:
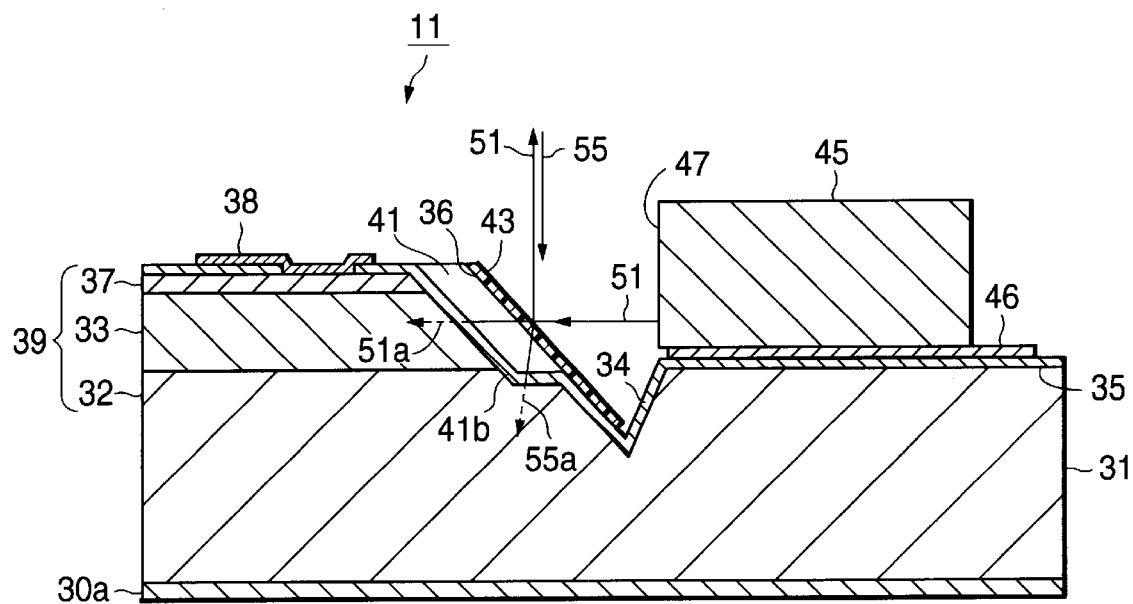
FIG. 4 is a schematic cross section showing the second embodiment of the present invention.
Figure 5:
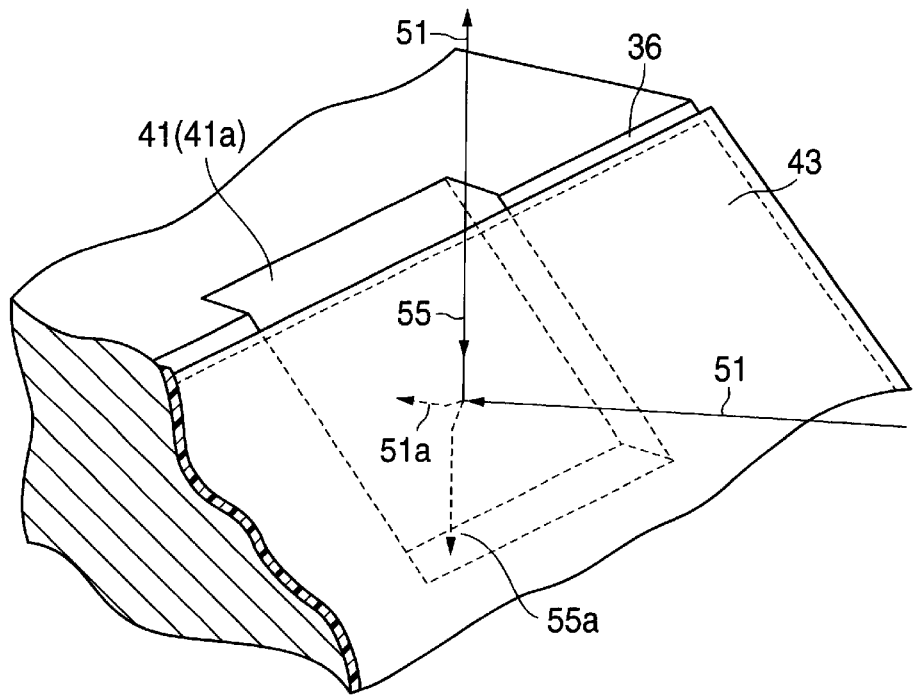
FIG. 5 is a partially enlarged oblique view showing a main part of FIG. 4.

FIGS. 4 and 5 show the second embodiment of the invention. Each portion with the same mark as that in FIGS. 1 and 2 denotes the same portion. In FIG. 4, mark 45 denotes the edge emission type semiconductor laser component mounted on the sub-mount substrate 31. The sub-mount substrate 31 is made of, for example, silicon (Si), and a layer 33 of low impurity concentration and a p-conduction type region 37 doped by high impurity concentration are successively formed on an n-type substrate 32 doped by high impurity concentration, by means of such as epitaxial growth, to form a pin type photodiode as the photo detector 39. The low concentration layer 33 constituting the optical input portion of the photo detector forms an edge of the optical input portion on the oblique surface 36 facing to the laser component 45 mounted on the sub-mount substrate 35. The p electrode 38 leading to the photodiode contacts the layer 37, and a bias voltage is applied between the p electrode and the reverse side electrode (n electrode) for the operation. The semitransparent mirror 43 is a multi-layered interference film of dielectric material formed on the oblique surface 36.

A groove 41a constituting an air gap layer 41 is formed between the semitransparent mirror 43 and the photo detector 39 by a predetermined depth by means of RIE, etc., and the surface of the groove is covered with an insulating film 41b of such as an oxide film. The groove 41a is formed in the vicinity of the oblique surface 36 so as to be practically parallel with the oblique surface. The groove 41a becomes the air gap layer 41 with a predetermined thickness covered up with the semitransparent mirror 43. This layer is a layer of air as the transparent medium.

The semiconductor laser component 45 is mounted on the substrate 35, facing to the photo detector 39, with the conductive adhesive 46 of such as solder, bordered by the groove 34 of the surface 35 of the sub-mount substrate. As shown in FIGS. 4 and 5, the emitted light 51 from the edge surface 47 with the optical axis parallel to the substrate 35 is reflected partially by the semitransparent mirror 43, and travels toward the upper side of the substrate i.e. the normal direction thereof. A part of the direct light beam 51a, which has passed through the mirror, enters the depletion layer extending in the low concentration layer 33, which becomes the optical input portion, after it passes through the air gap layer 41, and is absorbed by the depletion layer to be converted into a photocurrent. The return light 55 coming back from the outside along the same optical axis of the emitted light is reflected by the semitransparent mirror 43, and a part of the remainder becomes the return light beam 55a, which reaches the high concentration layer 32 via the semitransparent mirror 43 and the air gap layer 41. This region has little photosensitivity, so that no photocurrent generates.

Namely, the light beams 51a and 55a having passed through the semitransparent mirror 43 diverge from each other by using the difference of the traveling direction between the direct light beam 51a and the return light beam 55a while they are passing the air gap layer 41, and then enter the substrate 31 at respective different points. In this structure, the return light beam 55a deviates from the optical input portion 33, and consequently hardly enters it. Therefore the structure in which the optical input portion gets only the direct light beam 51a can be realized, and therefore makes the APC noise due to the return light reduced.

For example, in accordance with the structure of this embodiment, the return light beam 55a never crosses the direct light beam after they have passed the air gap portion, if the distance in the direction of the optical axis of the output light between the semiconductor laser 45 and the oblique surface 36 is 50 micrometers, the width of the air gap portion 41 in the direction normal to the oblique surface being 20 micrometers, the expanding angle of the output laser light beam 51 and that of the return light beam 55 being 7 degrees, and the tilt angle of the oblique surface being 45 degrees. Thus the structure in which the return light beam does not enter the optical input region of the photo detector can be realized.

In this embodiment, because the groove 34 is formed at the emitting edge surface side of the semiconductor laser component 45 on the sub-mount substrate surface 35, the output light beam 51 is not supposed to be eclipsed by the substrate surface even if the emitting portion of the semiconductor laser component 45 (i.e. the active layer) is relatively adjacent to the substrate surface. The oblique surface 36 is formed to be elevated continuously from the groove 34, and the semitransparent mirror 43 extends as far as the groove portion.

Figure 6:
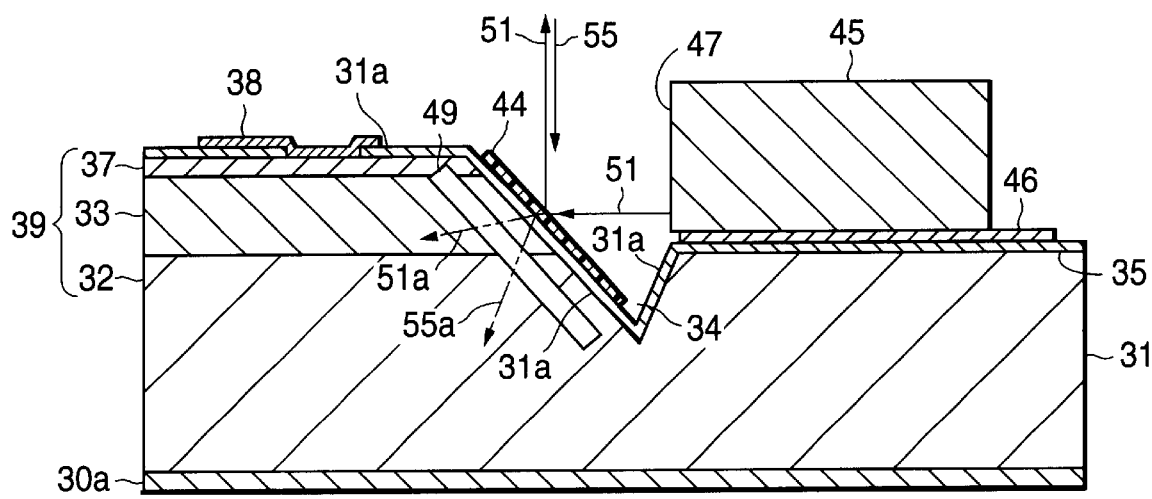
FIG. 6 is a schematic cross section showing the third embodiment of the present invention.
Figure 7:
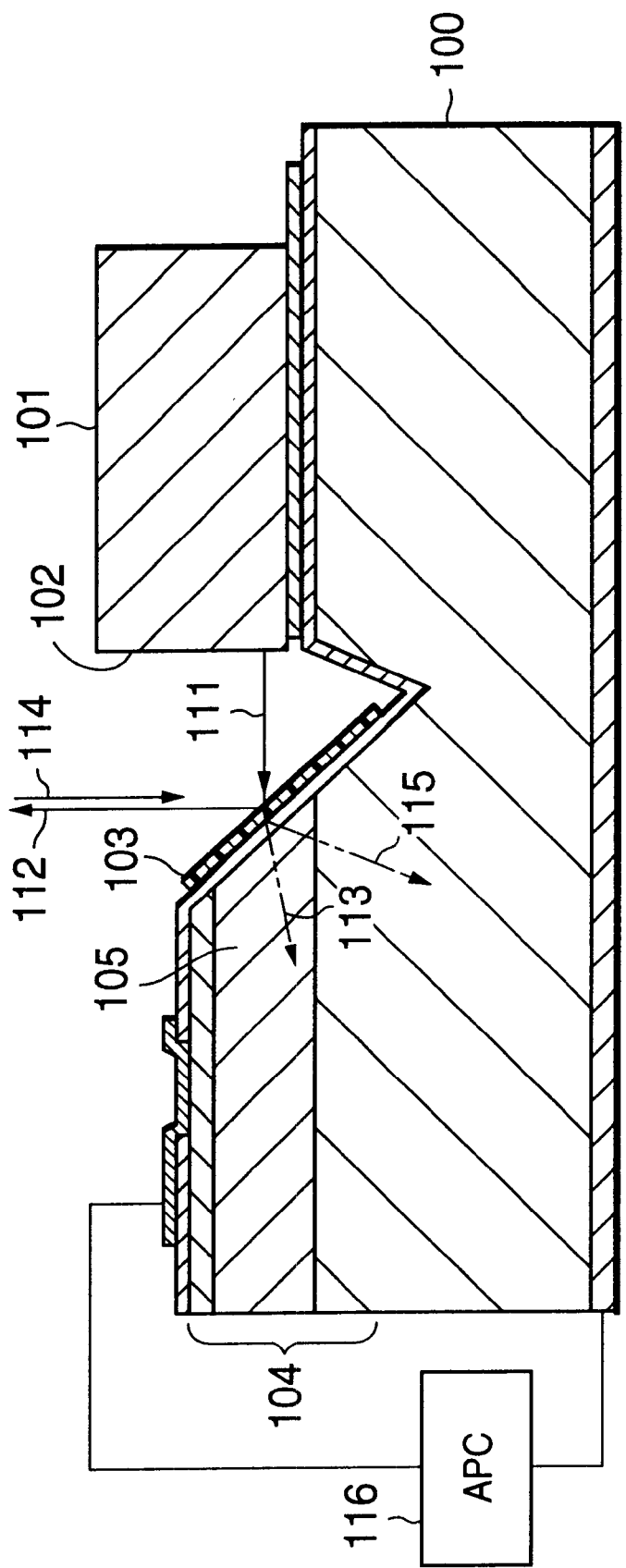
FIG. 7 is a schematic cross section showing a conventional semiconductor laser device.

FIG. 6 shows the third embodiment of the invention. Each portion with the same mark as FIG. 4 is the same portion. The structure according to this embodiment comprises an air gap layer 49, which is a closed space parallel to the semitransparent mirror 43 in the photo detector, and can be realized as follows.

In the first place, a wafer 31 in which the low concentration layer 33 and the high concentration p-layer are formed on the high concentration n-substrate by e.g. epitaxial growth is etched with a solution such as potassium hydroxide (KOH) until the bottom thereof reaches the substrate surface 35 by means of a mask that is a thermo-oxidized film or a nitride film patterned by, for example, photolithography process. A part of the substrate surface is patterned and etched by the same process in order to form the groove 34. In this case, the oblique surface 36 extending from the groove 34 to the edge surface of the photo detector 39 can be made of a specified crystal surface to obtain a flat surface by using an anisotropic etching solution such as KOH. Next a plurality of trenches are formed on the oblique surface 36 by, for example, RIE. Thereafter the trenches are heat-treated in a reducing atmosphere at about 1100 degrees Celsius for several tens minutes, and then a cavity by each trench begins to flow. The cavities are then taken in the silicon, and consequently openings of the trenches on the oblique surface 36 shut and become flat. A plurality of cavities taken in are connected with each other by further heat treatment, and a huge cavity as the air gap layer 49 is formed by the thin semiconductor layer 31b (This process is described in detail in Japanese unexamined patent disclosure No. 2000-12858 and T. Sato et al, Extended Abstract of Int. Elec. Device Meet. (IEEE) p. 517 (1999), etc.)

The size and the depth of the air gap layer 49 is absolutely determined by the size and the depth of the opening of each trench and the distance between trenches. Because the surface of the oblique surface 36 is made flat to be stable as a crystal, the surface uncovered by anisotropic etching is practically reproduced. The direction of the trench is the normal direction to the surface of the sub-mount substrate 31. It is characterized that the process is simple because the wafer can be processed with setting it horizontally. Furthermore, the surface of the sub-mount substrate 2 is removed by a process such as chemical mechanical polishing (CMP), so as to expose a part of the air gap layer 49. Moreover, the insulating layer 31a is formed with such as $SiO_2$ over the whole surface. The insulating layer 31a is as thin as about 1 μm at the most, it never affects the optical path of the light having passed therethrough. After the semitransparent mirror 44 has been formed with a dielectric film, the lead electrode 28 to the photodiode and the rear surface electrode 30a are formed by making contact holes in necessary portions of the insulating layer 31, and then chips are cut out by dicing etc.

Because this manufacturing method can make the air gap layer 49 and the semitransparent mirror 44 practically parallel to the oblique surface from the wafer surface of the sub-mount substrate 31 by a batch process, it comes to be possible that the photo detector with a mirror is integrated into the sub-mount in order to suppress the undesirable absorption of the direct light beam 33 as low as possible to reduce the return light noise, leading to realization of a miniaturized integrated semiconductor device of good productivity.

Although the high speed PIN structure is adopted as the structure of the photo detector in the abovementioned embodiment, the same effect can also be obtained by using a usual PN type photo detector.

Furthermore, the edge emission type was used as the semiconductor laser component in the embodiment mentioned above, but the surface emission type is also naturally applicable.

In accordance with the present invention, the optical input portion can be located at a position where almost all the central portion of the optical axis of the direct light beam enters the optical input portion in the photo detector, and where most of the return light beam does not reach the optical input portion, so that the return light noise mixed in the power control circuit (APC) for the semiconductor laser output can be decreased. Accordingly the intensity of the semiconductor laser output can be accurately and quickly controlled, so that an effect, which is effective to the light source for writing the optical disc, etc., can be obtained.

What is claimed is:

1. A semiconductor laser device comprising:
   a semiconductor laser component emitting a laser light; and
   an optical control mechanism located in front of the semiconductor laser component and comprising
     a semitransparent mirror reflecting the emitted laser light to control the direction of the optical axis of the laser light,
     a photo detector united with the semitransparent mirror and receiving a part of light having passed through the semitransparent mirror, and
     an optically transparent medium layer intervening between the semitransparent mirror and the photo detector, the optically transparent medium layer having a thickness to make an extra light coming back from the outside to the semitransparent mirror via the optical axis of the reflected laser light deviate from the optical input portion of the photo detector.

2. The semiconductor laser device as stated in claim 1, wherein the semiconductor laser component and the optical control mechanism are located on a single mount.

3. The semiconductor laser device as stated in claim 2, wherein a sub-mount formed with semiconductor is located between the semiconductor laser component and the mount, and the optical control mechanism is disposed in the sub-mount.

4. A semiconductor laser device comprising:
   a semiconductor laser component emitting a laser light from an emitting surface thereof;
   a semiconductor sub-mount mounting the semiconductor laser component on one main surface thereof to emit the laser light from the semiconductor laser having an optical axis parallel to the main surface;
   a semitransparent mirror facing to the emitting surface and positioned at a predetermined oblique angle to the optical axis, and changing the optical axis by reflecting the laser light emitted from the emitting surface, and permitting a part of the laser light to pass therethrough;
   a photo detector provided on the main surface side of the sub-mount and having an optical input portion receiving the light having passed through the semitransparent mirror; and
   a transparent medium layer with a predetermined width, intervening between the semitransparent mirror and the photo detector, the predetermined width of the transparent medium layer being a distance at which an extra light having passed through the semitransparent mirror via the changed optical axis enters the outside of the optical input portion, the extra light coming back from the outside to the semitransparent mirror via the optical axis of the reflected light.

5. The semiconductor laser device as stated in claim 4, wherein the semiconductor laser component is an edge emission type laser emitting light from an edge surface thereof, and the edge surface and the semitransparent mirror are located facing to each other.

6. The semiconductor laser device as stated in claim 1, wherein the transparent medium layer is a dielectric film.

7. The semiconductor laser device as stated in claim 1, wherein the semitransparent mirror, the transparent medium layer and the photo detector are laminated altogether in one united body.

8. The semiconductor laser device as stated in claim 1, wherein the transparent medium layer is silicon oxide ($SiO_2$).

9. The semiconductor laser device as stated in claim 1, wherein the transparent medium layer is an air gap.

10. The semiconductor laser device as stated in claim 9, wherein a concavity is formed in the optical input portion of the photo detector and the air gap is formed in the concavity by covering the opening of the concavity with the semitransparent mirror.

11. The semiconductor laser device as stated in claim 9, wherein the air gap is a closed space formed in the photo detector.

12. A semiconductor laser device comprising:
   a semiconductor laser component with an emitting surface emitting a laser light;
   a sub-mount substrate formed with first conduction type semiconductor, the semiconductor laser component being mounted on one main surface thereof, and a groove being formed on the emitting surface side thereof;
   a photo detector comprising
     a part of the sub-mount substrate,
     a low impurity semiconductor region provided facing to the emitting surface via the groove, and
     a second conduction type semiconductor region provided on the low impurity semiconductor region, the photo detector further comprising a light incident surface formed in the low impurity region as an optical input portion;
   a semitransparent mirror located between the semiconductor laser component and the photo detector, reflecting the laser light emitted from the emitting surface of the semiconductor laser component to change an optical axis of the laser light, permitting a part of the light to pass therethrough, and being provided tilting to the optical axis; and
   a transparent medium layer provided between the light incident surface of the optical input portion of the photo detector and the semitransparent mirror, and having a thickness by which an extra light deviates from the light incident surface, the light coming back from the outside to the semitransparent mirror via the optical axis of the reflected light.

13. The semiconductor laser device as stated in claim 1, wherein the angle between the optical axis of the laser light and the surface of the semitransparent mirror is substantially 45 degrees.

14. The semiconductor laser device as stated in claim 1, wherein the semiconductor laser device is a light source for an optical head.

15. The semiconductor laser device as stated in claim 12, wherein the semiconductor laser device is a light source for an optical head.

16. The semiconductor laser device as stated in claim 4, wherein the semiconductor laser device is a light source for an optical head.

17. The semiconductor laser device as stated in claim 4, wherein the transparent medium layer is a dielectric film.

18. The semiconductor laser device as stated in claim 12, wherein the transparent medium layer is a dielectric film.

19. The semiconductor laser device as stated in claim 4, wherein the semitransparent mirror, the transparent medium layer and the photo detector are laminated altogether in one united body.

20. The semiconductor laser device as stated in claim 12, wherein the semitransparent mirror, the transparent medium layer and the photo detector are laminated altogether in one united body.

21. The semiconductor laser device as stated in claim 4, wherein the transparent medium layer is silicon oxide ($SiO_2$).

22. The semiconductor laser device as stated in claim 12, wherein the transparent medium layer is silicon oxide ($SiO_2$).

23. The semiconductor laser device as stated in claim 4, wherein the transparent medium layer is an air gap.

24. The semiconductor laser device as stated in claim 12, wherein the transparent medium layer is an air gap.

25. The semiconductor laser device as stated in claim 4, wherein the angle between the optical axis of the laser light and the surface of the semitransparent mirror is substantially 45 degrees.

26. The semiconductor laser device as stated in claim 12, wherein the angle between the optical axis of the laser light the surface of the semitransparent mirror is substantially 45 degrees.

* * * * *